United States Patent
Han et al.

(10) Patent No.: US 11,626,306 B2
(45) Date of Patent: Apr. 11, 2023

(54) METHOD FOR ANALYZING A SEMICONDUCTOR DEVICE

(71) Applicant: SK hynix Inc., Icheon-si Gyeonggi-do (KR)

(72) Inventors: Jin Hee Han, Yongin-si Gyeonggi-do (KR); Byoung Ho Lee, Seongnam-si Gyeonggi-do (KR); Chang Hwan Lee, Suwon-si Gyeonggi-do (KR); Jung Min Lee, Sejong-si (KR); Seong Min Ma, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/681,201

(22) Filed: Feb. 25, 2022

(65) Prior Publication Data

US 2022/0277975 A1    Sep. 1, 2022

Related U.S. Application Data

(62) Division of application No. 16/667,499, filed on Oct. 29, 2019, now Pat. No. 11,295,970.

(30) Foreign Application Priority Data

Jul. 23, 2019    (KR) .................... 10-2019-0088824

(51) Int. Cl.
| | | |
|---|---|---|
| *H01L 21/67* | (2006.01) | |
| *G01B 11/00* | (2006.01) | |
| *H01L 21/66* | (2006.01) | |
| *H01L 21/306* | (2006.01) | |
| *H01L 21/02* | (2006.01) | |

(Continued)

(52) U.S. Cl.
CPC ...... *H01L 21/67288* (2013.01); *G01B 11/002* (2013.01); *G01B 11/24* (2013.01); *G01B 15/04* (2013.01); *H01L 21/02057* (2013.01); *H01L 21/306* (2013.01); *H01L 21/67028* (2013.01); *H01L 21/67063* (2013.01); *H01L 21/67069* (2013.01); *H01L 21/67075* (2013.01); *H01L 21/67167* (2013.01); *H01L 22/12* (2013.01); *H01L 21/67242* (2013.01)

(58) Field of Classification Search
None
See application file for complete search history.

(56) References Cited

U.S. PATENT DOCUMENTS

| | | |
|---|---|---|
| 6,317,514 B1 | 11/2001 | Reinhorn et al. |
| 6,979,819 B2 | 12/2005 | Adler et al. |
| 2018/0040695 A1* | 2/2018 | Smith ............... H01L 29/0673 |

(Continued)

FOREIGN PATENT DOCUMENTS

| | | |
|---|---|---|
| KR | 1020160034491 A | 3/2016 |
| KR | 1020160086473 A | 7/2016 |
| KR | 101913020 B1 | 10/2018 |

*Primary Examiner* — Michelle Mandala
(74) *Attorney, Agent, or Firm* — William Park & Associates Ltd.

(57) ABSTRACT

A method for analyzing a semiconductor device includes repeatedly etching an entire surface of a wafer at a same etch rate by a target depth to expose a next surface of the wafer. The method includes obtaining two-dimensional structure information from each repeatedly etched surface of the wafer and serially stacking the repeatedly obtained two-dimensional structure information to generate a three-dimensional image.

14 Claims, 7 Drawing Sheets

(51) Int. Cl.
*G01B 11/24* (2006.01)
*G01B 15/04* (2006.01)

(56) References Cited

U.S. PATENT DOCUMENTS

2019/0326301 A1* 10/2019 Smith ................. H01L 27/1104
2020/0006080 A1  1/2020 Osawa et al.
2020/0168513 A1  5/2020 Sawai

* cited by examiner

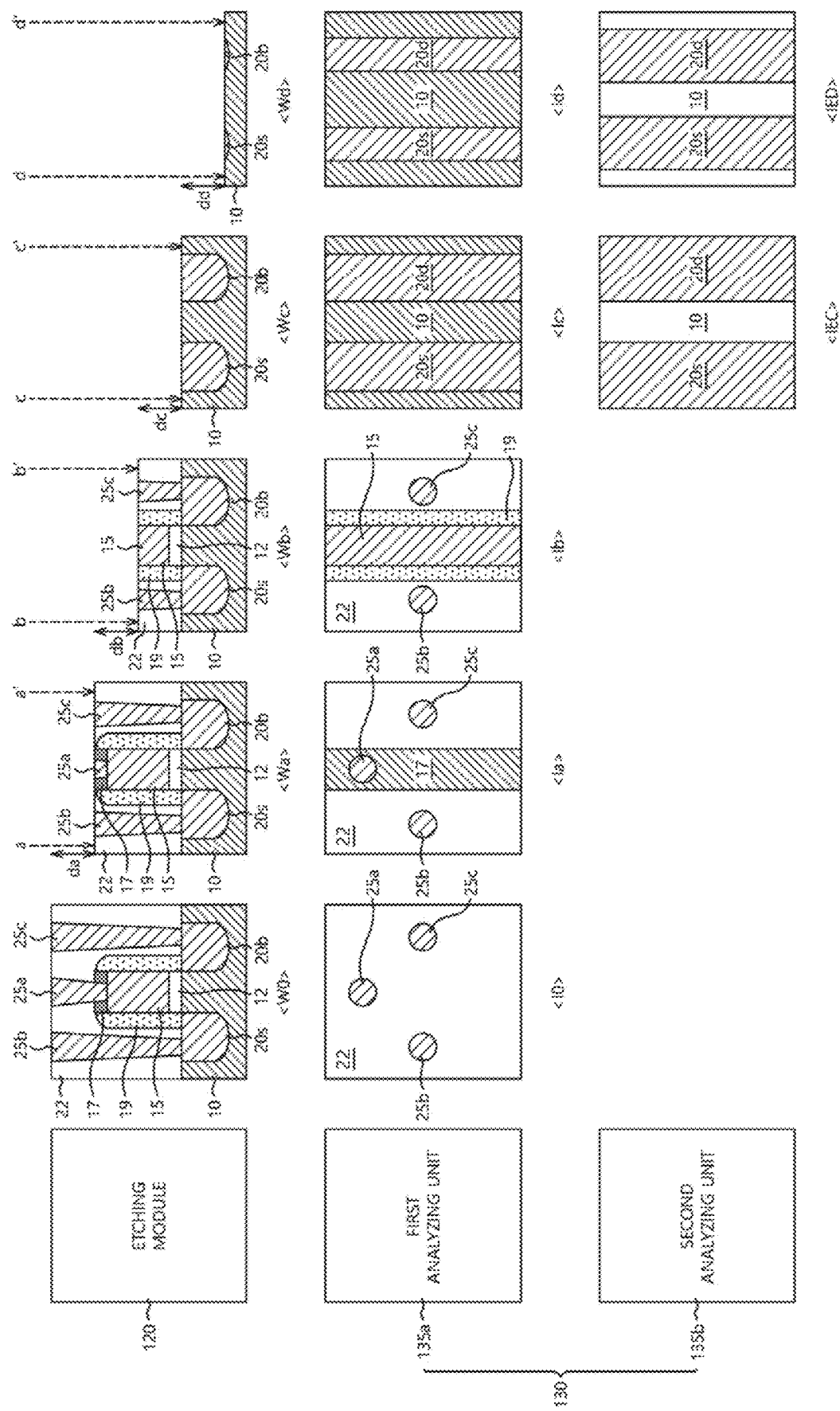

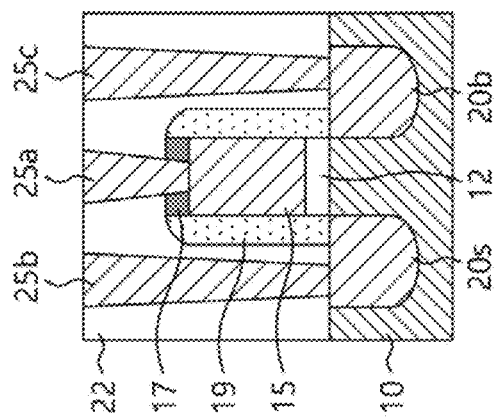
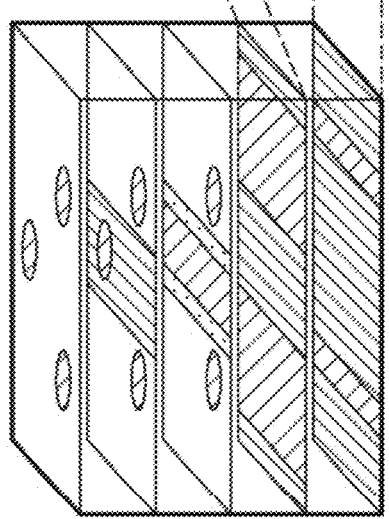
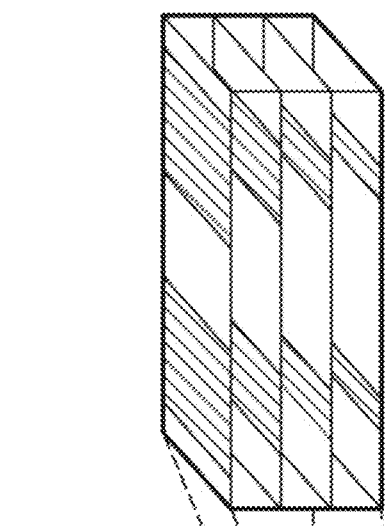
FIG. 10A
FIG. 10B
FIG. 10C

METHOD FOR ANALYZING A SEMICONDUCTOR DEVICE

CROSS-REFERENCE TO RELATED APPLICATIONS

The present application is a divisional application of U.S. patent application Ser. No. 16/667,499, filed on Oct. 29, 2019, and claims priority under 35 U.S.C. § 119(a) to Korean application number 10-2019-0088824, filed on Jul. 23, 2019, in the Korean Intellectual Property Office, which is incorporated herein by reference in its entirety.

BACKGROUND

1. Technical Field

Various embodiments may generally relate to a system and method for analyzing a semiconductor device, and, more particularly, a system and method for analyzing a structure of a semiconductor device.

2. Related Art

Present technologies for the fabrication of semiconductor devices may generate highly-integrated three-dimensional structures having sizes on the order of a few dozen nanometers. Patterns having such three-dimensional structure may have various defects in deep portions of the patterns. These defects in the deep portions of the patterns might not be found using current semiconductor inspection equipment for obtaining two-dimensional information.

SUMMARY

In example embodiments of the present disclosure, a system for analyzing a semiconductor device includes an etching module for repeatedly etching an entire surface of a wafer at a same etch rate to expose a next surface of the wafer at a next depth where an object to be analyzed exits. The system also includes an analyzing module for repeatedly obtaining two-dimensional structure information from each repeatedly etched surface of the wafer. The system further includes a computing apparatus for serially stacking the repeatedly obtained two-dimensional structure information to generate a three-dimensional image.

In example embodiments, the etching module includes at least one of a milling apparatus for irradiating the entire surface of the wafer with an ion beam, a chemical mechanical polishing (CMP) apparatus, a dry etching apparatus, and a wet etching apparatus.

The analyzing module may include a calibrating apparatus, an inspecting apparatus, and an analyzing apparatus configured to use a light, an electron beam and an X-ray for obtaining the two-dimensional information. For example, the analyzing module may include at least one of a scanning electron microscope (SEM), a photoelectron emission microscopy (PEEM), an X-rays photoelectron spectroscopy (XPS), Energy Dispersive X-ray analysis (EDX) and an optical metrology/inspection tool.

Wherein the repeatedly obtained two-dimensional structure information includes two-dimensional images, the computing apparatus may include a controller for classifying the two-dimensional images according to etched depths and two-dimensional coordinates (X, Y) for serially stacking the two-dimensional images based on the etched depths and two-dimensional coordinates to generate the three-dimensional image. The computing apparatus may also include memory for storing the classified two-dimensional images.

In example embodiments of the present disclosure, a method of analyzing a semiconductor device includes repeatedly etching an entire surface of a wafer at a same etch rate by a target depth to expose a next surface of the wafer. The method also includes repeatedly obtaining two-dimensional structure information from each repeatedly etched surface of the wafer. The method further includes serially stacking the repeatedly obtained two-dimensional structure information to generate a three-dimensional image.

In example embodiments, obtaining the two-dimensional structure information includes obtaining two-dimensional physical information of the wafer and obtaining two-dimensional electrical information of the wafer.

BRIEF DESCRIPTION OF THE DRAWINGS

The above and another aspects, features, and advantages of the subject matter of the present disclosure will be more clearly understood from the following detailed description taken in conjunction with the accompanying drawings, in which:

FIGS. 9, 10A, 10B, and 10C are views illustrating a method of analyzing a semiconductor device using the analyzing module in FIG. 8.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
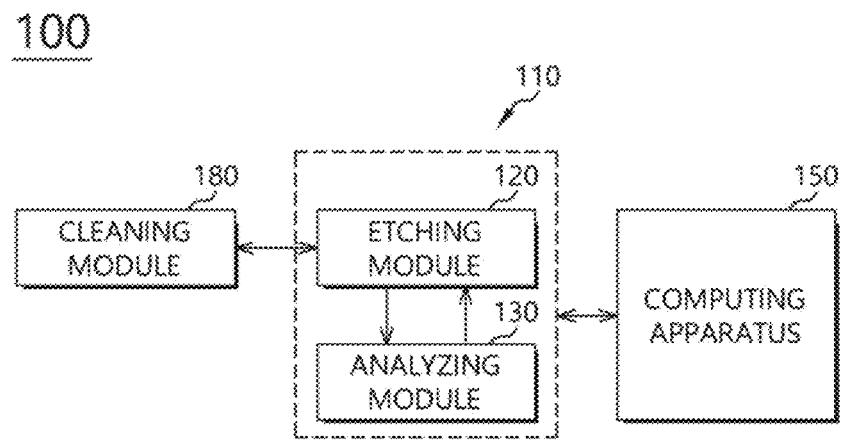
FIG. 1 is a block diagram illustrating a system for analyzing a semiconductor device in accordance with example embodiments.

FIG. 1 is a block diagram illustrating a system 100 for analyzing a semiconductor device in accordance with example embodiments.

Referring to FIG. 1, the system 100 for analyzing a semiconductor device may include a two-dimensional information inspection apparatus 110, a computing apparatus 150, and a cleaning module 180. The two-dimensional information inspection apparatus 110 may include an etching module 120 and an analyzing module 130.

The etching module 120 may etch an entire surface of a wafer at a same etch rate by a uniform thickness (depth) i.e., an etch target thickness (etch target depth). The same etch rate means that different areas of the surface of the wafer are etched by substantially the same distance during the same duration of time. For example, the etching module 120 may include an ion beam milling apparatus using an ion beam etch, a chemical mechanical polishing (CMP) apparatus, a dry etching apparatus, or a wet etching apparatus configured to etch the entire surface of the wafer having a size of about 300 mm. The ion beam milling apparatus may remove a layer on the entire surface of the wafer by an irradiation of the ion beam in a sputtering manner. The ion beam milling apparatus may uniformly irradiate, with the ion beam, the entire surface of the wafer to remove the entire surface of the wafer by the uniform thickness. The CMP apparatus may remove the entire surface of the wafer by the uniform thickness using a polishing pad.

The etch target thickness (etch target depth) may be set in accordance with inspection positions of the wafer. For example, the etch target thickness might be no more than about 10 nm considered an etching depth resolution.

In example embodiments, the etching module 120 may etch various layers on the wafer at the same etch rate by the uniform target depth (thickness). For example, etch rates by the layers on the wafer may be about 1. When the etching module 120 includes the ion beam milling apparatus, the milling apparatus may include at least one ion beam source to remove the layers on the wafer at the same etch rate.

The analyzing module 130 may obtain two-dimensional structure information of an etched surface of the wafer etched by the etching module 120. For example, the analyzing module 130 may obtain a two-dimensional image of the etched surface of the wafer from ions and electrons emitted from the wafer w. The analyzing module 130 may include a calibrating apparatus, an inspecting apparatus, and an analyzing apparatus configured to use a light, an electron beam, and an X-ray for obtaining the two-dimensional information. For example, the analyzing module 130 may include at least one of a scanning electron microscope (SEM) apparatus, a photoelectron emission microscopy (PEEM) apparatus, an X-ray photoelectron spectroscopy (XPS) apparatus, Energy Dispersive X-ray analysis (EDX) apparatus and an optical metrology/inspection tool. Additionally, the analyzing module 130 may include a mass spectrometer and/or an optical emission spectroscopy (OES) apparatus. The mass spectrometer and/or the OES apparatus may measure an amount of byproducts generated in etching the wafer w. The mass spectrometer and/or the OES apparatus may provide the computing apparatus 150 with the amount of the byproducts. The computing apparatus 150 may control the target depth of the etching module 120. The computing apparatus 150 may analyze properties of the byproducts.

Figure 2:
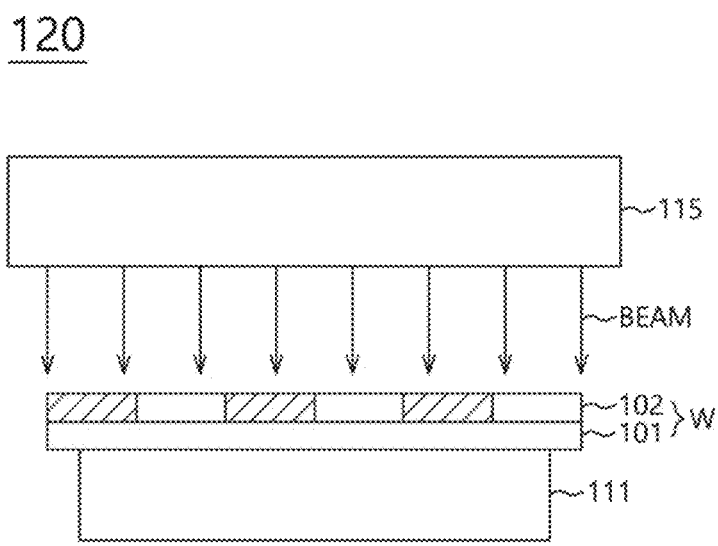
FIG. 2 is a cross-sectional view illustrating an etching module in accordance with example embodiments.

FIG. 2 is a cross-sectional view illustrating the etching module 120 of FIG. 1 in accordance with example embodiments.

Referring to FIG. 2, the etching module 120 may include, for an embodiment, the milling apparatus using the ion beam. Hereinafter, such an embodiment is described and the reference numeral 120 of the etching module refers to the milling apparatus.

The milling apparatus 120 may include a stage 111 configured to support the wafer w. The wafer w may include a semiconductor substrate 101 and a circuit layer 102 including a plurality of materials on the semiconductor substrate 101.

The milling apparatus 120 may include an ion irradiator 115, also referred to as an ion accelerator, configured to accelerate ions to irradiate the entire surface of the wafer w with ion beams BEAM. The ion irradiator 115 may be arranged over the stage 111. The ion irradiator 115 may have a diameter longer than that of the wafer w. The ion irradiator 115 may irradiate with the ion beams BEAM to uniformly etch the entire surface of the wafer w, i.e., a surface of the circuit layer 102 by the uniform thickness in a direction substantially perpendicular to a surface of the semiconductor substrate 101. The ion beams BEAM may be incident to the surface of the wafer w in various directions.

In example embodiments, the milling apparatus 120 may concentrate a focused ion beam (FIB) on the surface of the wafer w using a FIB device or irradiate a cluster ion beam (CIB) on the surface of the wafer w using a CIB device. The ion beams generated by the FIB manner or the CIB manner may be irradiated to the entire surface of the wafer w to etch the entire surface of the circuit layer 102 by the uniform thickness.

For example, the milling apparatus 120 may use Ar ions as an etch ion.

When the milling apparatus 120 uses the FIB or the CIB, the etch ion may include a metal source having a low melting point and a low reactivity. The metal source may include Al, As, Au, Be, Bi, Cs, Cu, Ga, Ge, Fe, In, Li, Ni, Pb, Pd, Pr, Pt, Zn, etc. For example, the milling apparatus 120 may heat a solid Ga source to generate $Ga^+$ ions. The milling apparatus 120 may include an ion gun configured to accelerate and irradiate the $Ga^+$ ions using an accelerating voltage. For example, the ion gun may generate the ion beams having an accelerating voltage of about 30 keV or above. When the ion beams generated by the milling apparatus 120 irradiate the surface of the wafer w, the ions and the electrons may be emitted from the surface of the wafer w. A milling speed of the ion beam and a depth resolution of the ion beam may be controlled by a current of the ion beam and an incident angle of the ion beam to the surface of the wafer w.

When the etching module 120 includes the FIB apparatus or the CIB apparatus, the analyzing module 130 may be arranged in the etching module 120. The analyzing module 130 may be positioned over the wafer w to detect the ions and the electrons emitted from the wafer w. The SEM apparatus 130 may obtain the two-dimensional image of the wafer w from the ions and the electrons emitted from the wafer w.

Referring to FIG. 1, the computing apparatus 150 may serially stack the two-dimensional (image) information obtained from the analyzing module 130 to obtain the three-dimensional image.

Figure 3:
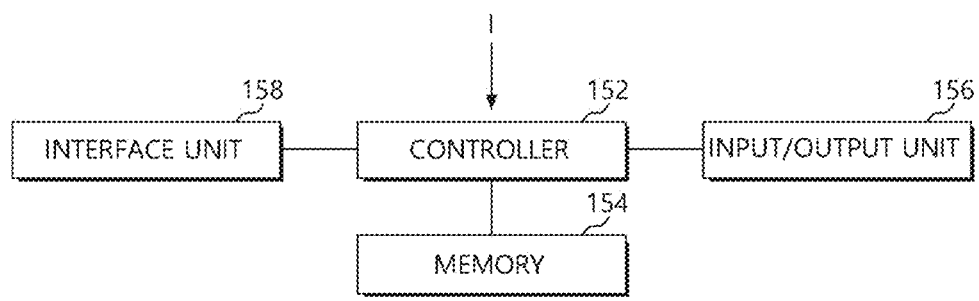
FIG. 3 is a block diagram illustrating a computing module in accordance with example embodiments.

FIG. 3 is a block diagram illustrating the computing apparatus 150 of FIG. 1 in accordance with example embodiments.

Referring to FIG. 3, the computing apparatus 150 may include a controller 152, a memory 154, an input/output unit 156, and an interface unit 158.

The controller 152 may calculate various process-monitoring data based on the two-dimensional images I obtained from the analyzing module 130. The calculation of the controller 152 may be driven in accordance with an algorithm designed for calculating the process-monitoring data. The controller 152 may serially stack the two-dimensional images obtained from the analyzing module 130 to generate the three-dimensional image.

The memory 154 may include a non-volatile storage medium. For example, the memory 154 may include a hard disk and/or a memory of a non-volatile semiconductor device such as a flash memory, a phase change memory, a magnetic memory, etc. The memory 154 may store the two-dimensional images obtained from the analyzing module 130 and the image data such as parameters and the three-dimensional image processed by the computing apparatus 150.

The input/output unit 156 may include a keyboard, a keypad, and/or a display device.

The image data obtained from the two-dimensional information inspection apparatus 110 may be transmitted to the computing apparatus 150 through the interface unit 158. The data processed by the computing apparatus 150 may be transmitted to the inspection apparatus 110 or other external devices, such as a data server or an agent policy center (APC) server, through the interface unit 158. The interface unit 158 may include a wire communication device, a wireless communication device, and/or a universal serial bus (USB) port. The controller 152, the memory 154, the input/output unit 156, and the interface unit 158 may be coupled to each other via a data bus.

Referring to FIG. 1, the cleaning module 180 may clean the etched surface of the wafer w etched by the uniform depth. The cleaning module 180 may include a wet cleaning apparatus or a dry cleaning apparatus.

Figure 4:
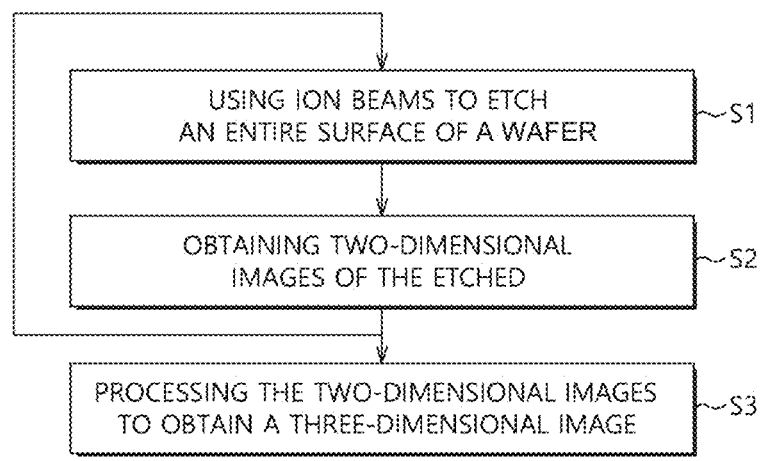
FIG. 4 is a flow chart illustrating operations of a system for analyzing a semiconductor device in accordance with example embodiments.
Figure 5:
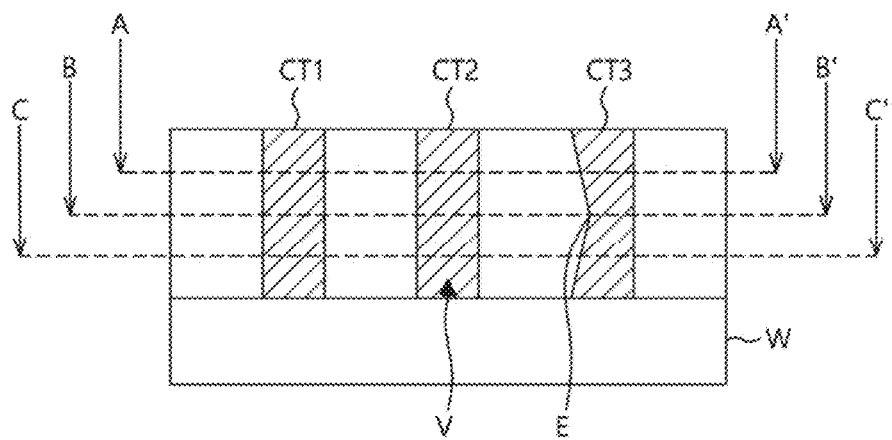
FIG. 5 is a cross-sectional view illustrating an etched surface of a wafer in accordance with example embodiments.
Figure 6:
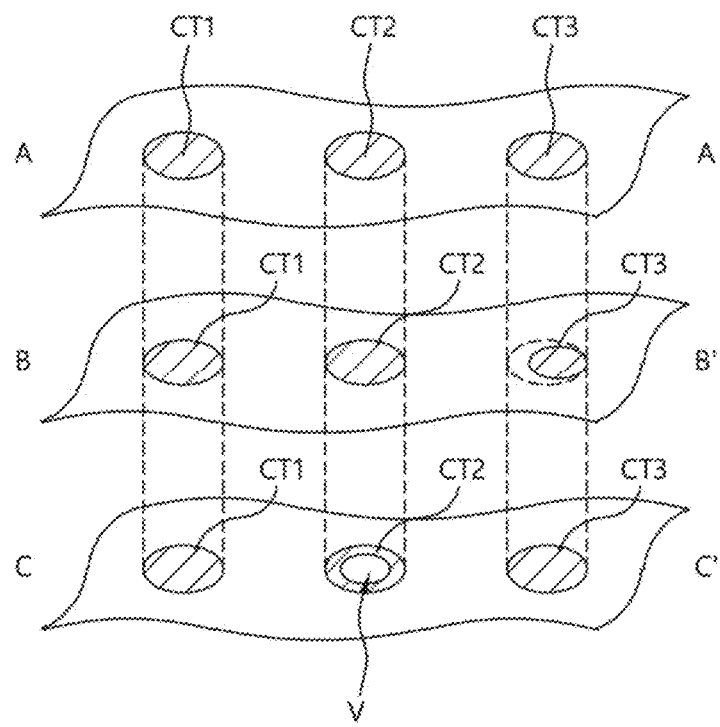
FIG. 6 is a view illustrating a two-dimensional image of the etched surface of the wafer in FIG. 5.
Figure 7:
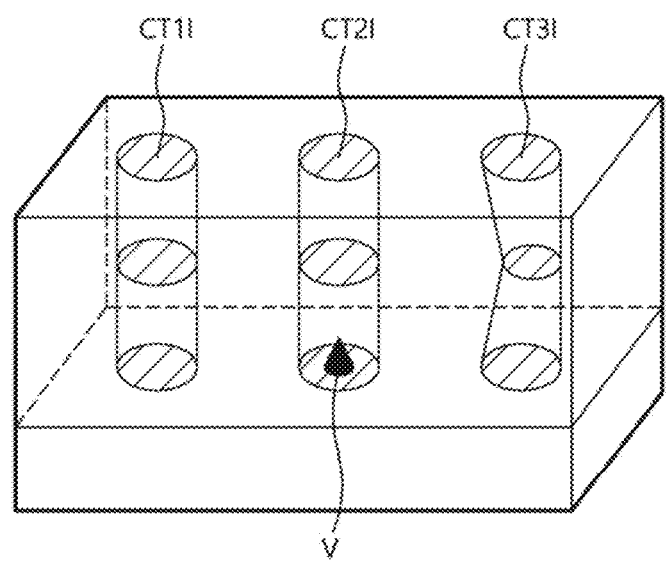
FIG. 7 is a view illustrating a three-dimensional image generated from the two-dimensional image in FIG. 6.

FIG. 4 is a flow chart illustrating operations of a system for analyzing a semiconductor device in accordance with example embodiments, FIG. 5 is a cross-sectional view illustrating an etched surface of a wafer in accordance with example embodiments, FIG. 6 is a view illustrating a two-dimensional image of the etched surface of the wafer in FIG. 5, and FIG. 7 is a view illustrating a three-dimensional image generated from the two-dimensional image in FIG. 6. In example embodiments, the etching module 120 may include the milling apparatus. The wafer w may include a plurality of contact plugs CT1, CT2, and CT3 (CT1~CT3).

Referring to FIGS. 4 and 5, the wafer w may be loaded into the two-dimensional information inspection apparatus 110. For operation 51, the etching module 120 may, using ion beams, uniformly irradiate and etch the entire surface of the wafer w by the target depth. For example, the ion beams may be primarily irradiated to a surface A-A' of the wafer w in FIG. 5 by a primary target depth. Thus, the surface of the wafer w may be sputtered and etched by the ion beams to the uniform depth. While etching the wafer w by the ion beams, the mass spectrometer or the OES in the analyzing module 130 may measure the amount of byproducts. An etched depth of the wafer w may be determined and thus controlled based on the amount of the byproducts.

For operation S2, the analyzing module 130 may measure electrons emitted from the surface of the wafer w to obtain the two-dimensional image of the etched surface of the wafer w. After the ion beam milling, the analyzing module 130 such as the SEM, EDX or the PEEM may generate the two-dimensional image of the etched surface of the wafer w.

The ion beams are used to repeat the etch of the wafer w down to a next surface B-B' in FIG. 5 as the target depth, a two-dimensional image of the etched surface B-B' of the wafer w is obtained, and the ion beams are then used to repeat the etch of the wafer w down to a next surface C-C' in FIG. 5 as the target depth, and obtaining a two-dimensional image of the etched surface C-C' surface of the wafer w. This cycle of etching by a target depth and then obtaining a two-dimensional image may be repeatedly performed. Gaps between the target depths of A-A', B-B', and C-C' in FIG. 5 may be changed. Additionally, the surface of the wafer w may be cleaned for obtaining the two-dimensional image and then etched again.

Under ideal conditions, the two-dimensional image of the surface A-A', the two-dimensional image of the surface B-B' and the two-dimensional image of the surface C-C' might be substantially identical to each other. Realistically, however, in a highly integrated three-dimensional device, sizes and shapes of the contact plugs CT1~CT3 may not be uniform and/or a void v may be generated in the contact plug CT1~CT3. The void v and/or the shape error may be detected in the two-dimensional images in accordance with detection points. Further, a shape of a three-dimensional pattern of the highly integrated semiconductor device may not be predicted.

In example embodiments, referring to FIG. 6, in operation S3, the controller 152 of the computing apparatus 150 may serially stack the two-dimensional information such as the two-dimensional images obtained by the analyzing module 130 to obtain the three-dimensional image data. The controller 152 may classify the two-dimensional information measured by the analyzing module 130 along X-Y directions by the etched depths. The controller 152 may provide the memory 154 with the classified two-dimensional information. Particularly, the controller 152 may classify the two-dimensional images of the entire surface of the wafer w into two-dimensional coordinates (X, Y). The controller 152 may provide the memory 154 with the two-dimensional coordinates (X, Y). Further, the controller 152 may classify the two-dimensional information by an etched depth sequence. The controller 152 may provide the memory 154 with the classified two-dimensional information by the etched depth sequence. Although not depicted in FIG. 3, an additional noise filter for filtering noise in the two-dimensional images may be arranged in the controller 152.

The controller 152 may align the X-Y coordinates of the two-dimensional images and order by the target depth to stack the two-dimensional images, thereby obtaining the three-dimensional image. A detail shape of a three-dimensional structure on the wafer w may be predicted based on a fault image of the wafer w.

For example, an image of the third contact plug CT3 on the surface B-B' in FIG. 6 may have a size smaller than that of an image of the third contact plug CT3 on the surface A-A' or C-C', and an image of the third contact plug CT3 on the surface B-B' in FIG. 6 may be shifted from an image of the third contact plug CT3 on the surface A-A' or C-C'. In a three-dimensional image of the third contact plug CT3 in FIG. 7, the third contact plug CT3 is shown to have different diameters. Thus, the computing apparatus 150 may detect the shape failure, i.e., a physical defect in the third contact plug CT3. The computing apparatus 150 may calculate a size of the third contact plug CT3, a distance between the contact plugs CT1~CT3, resistances of the contact plugs CT1~CT3, and predicted process parameters.

For example, as shown in FIG. 6, when the cross-sectional image of the second contact plug CT2 on the surface C-C' may have an annular shape, it can be noted that a void may be generated at the surface C-C' of the second contact plug CT2. Further, a portion of the three-dimensional image corresponding to the void may have a color or transparency different from those of other portions of the three-dimensional image. The controller 152 of the computing apparatus 150 may rotate and deform (expand and reduce) the contour of the three-dimensional image. Thus, the shape failure and the internal failure of the three-dimensional image may be readily detected.

The controller 152 of the computing apparatus 150 may store the two-dimensional images of the wafer w in accordance with the etched depths and the two-dimensional coordinates (X, Y). Therefore, when the input/output unit 156 inputs the etched depth and the two-dimensional coordinate (X, Y) of a region of an interest (ROI), the controller 152 may rotate and/or deform the image of the ROI. The controller 152 may output the image of the ROI to provide the user with the outputted image.

Figure 8:
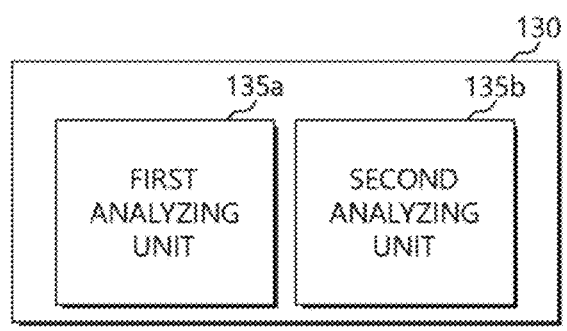
FIG. 8 is a block diagram illustrating an analyzing module in accordance with example embodiments.

FIG. 8 is a block diagram illustrating the analyzing module 130 in accordance with example embodiments, and FIGS. 9 and 10 are views illustrating a method of analyzing a semiconductor device using the analyzing module 130 in FIG. 8.

Referring to FIG. 8, the analyzing module 130 may include a first analyzing unit 135a and a second analyzing unit 135b. For example, the first analyzing unit 135a may include an SEM apparatus configured to detect a physical image of an etched surface. The second analyzing unit 135b may include an EDX apparatus or a PEEM apparatus configured to display electrical characteristics of the etched surface. The second analyzing unit 135b such as the PEEM apparatus may diagram the electrical characteristics such as a concentration distribution of particles.

Hereinafter, a method of inspecting the semiconductor device using the analyzing modules in FIG. 8 is described and illustrated in detail with reference to FIGS. 9 and 10.

A wafer resultant <w0> may be prepared. The wafer resultant <w0> may include a semiconductor substrate 10 including a MOS transistor. The MOS transistor may include a gate structure, a source 20s, and a drain 20d on the semiconductor substrate 10. The gate structure may include a gate insulation layer 12, a gate 15, and a hard mask layer 17 sequentially stacked. The gate structure may further include a spacer 19 on sidewalls of the gate insulation layer 12, the gate 15, and the hard mask layer 17. The source 20s and the drain 20d may be formed in the semiconductor substrate 10 at both sides of the gate structure. The wafer resultant <w0> may further include an insulating interlayer 22 configured to cover the MOS transistor and contacts 25a, 25b, and 25c. The contacts 25a, 25b, and 25c may be formed in the insulating interlayer 22. The contacts 25a, 25b, and 25c may make contact with the gate 15, the source 20s, and the drain 20d, respectively.

The first analyzing unit 135a may measure an image I0 of an upper surface of the wafer resultant <w0>. Because the first analyzing unit 135a may detect the physical image, the image I0 may display the insulating interlayer 22 and the contacts 25a, 25b, and 25c. Physical information such as shapes and positions of the contacts 25a, 25b, and 25c may be recognized from the image I0.

The etching module 120 may etch the wafer w by a first target depth da to expose a first surface a-a' of the wafer w. For example, the first target depth da may be a distance from the surface of the wafer resultant <w0> to a surface of the hard mask layer 17. The first analyzing unit 135a may measure a physical image Ia of the exposed first surface a-a' of the wafer w. The physical image Ia of the first surface a-a' of the wafer w may display shapes and positions of the insulating interlayer 22, the contacts 25a, 25b, and 25c and the hard mask layer 17 having different properties.

The etching module 120 may then etch the wafer w by a second target depth db to expose a second surface b-b' of the wafer w. For example, the second target depth db may allow for exposing the gate 15. The first analyzing unit 135a may measure a physical image Ib of the exposed second surface b-b' of the wafer w. The physical image Ib of the second surface b-b' of the wafer w may display shapes and positions of the insulating interlayer 22, the contacts 25a, 25b, and 25c, the gate 15, and the spacer 19 having different properties.

The etching module 120 may then etch the wafer w by a third target depth dc to expose a third surface c-c' of the wafer w. For example, the third target depth dc may allow for exposing the surface of the semiconductor substrate 10. The first analyzing unit 135a and the second analyzing unit 135b may measure a two-dimensional physical image Ic and an electrical image IEc of the exposed third surface c-c' of the wafer w. The two-dimensional physical image Ic measured by the first analyzing unit 135a may display shapes and positions of the semiconductor substrate 10, the source 20s, and the drain 20d having different properties. The two-dimensional electrical image IEc measured by the second analyzing unit 135b may display positions of the source 20s and the drain 20d, and the concentration distribution of the impurities. As shown the two-dimensional electrical image IEc, it can be noted that impurity concentrations in the source 20s and the drain 20d may be decreased toward edge portions in accordance with Gaussian distribution.

The etching module 120 may then etch the wafer w by a fourth target depth dd to expose a fourth surface d-d' of the wafer w. For example, the fourth target depth dd may allow for exposing bottom surfaces of the source 20s and the drain 20d. The first analyzing unit 135a and the second analyzing unit 135b may measure a two-dimensional physical image Id and an electrical image IEd of the exposed fourth surface d-d' of the wafer w. The two-dimensional physical image Id measured by the first analyzing unit 135a may display shapes and positions of the semiconductor substrate 10, the source 20s, and the drain 20d having different properties. Because the source 20s and the drain 20d may be impurity regions, doping concentrations of the source 20s and the drain 20d may be gradually decreased toward lower portions of the source 20s and the drain 20d in accordance with Gaussian distribution. Further, widths of the source 20s and the drain 20d may also be gradually decreased toward the lower portions of the source 20s and the drain 20d. Therefore, the widths of the source 20s and the drain 20d exposed through the fourth surface d-d' of the wafer w may be narrower than the widths of the source 20s and the drain 20d exposed through the third surface c-c' of the wafer w. The two-dimensional electrical image IEd measured by the second analyzing unit 135b may display the concentration distribution of the source 20s and the drain 20ds. As shown the two-dimensional electrical image IEd, it can be noted that an impurity concentration in the source 20s and the drain 20d at the fourth surface d-d' of the wafer w may be lower than that in the source 20s and the drain 20d at the third surface c-c' of the wafer w.

The controller 152 of the computing apparatus 150 may collect the two-dimensional images I0, Ia, Ib, Ic, Id, IEc, and IEd obtained from the analyzing module 130. As shown in FIGS. 10A, 10B, and 10C, the controller 152 may serially stack the two-dimensional images to generate a three-dimensional image b corresponding to an actual structure a. Further, the two-dimensional physical images I0, Ia, Ib, Ic, and Id obtained by the first analyzing unit 135a and the two-dimensional electrical images IEc and IEd may be synthesized with each other to obtain shapes, positions, and electrical characteristic distributions of elements in the actual structure in the three-dimensional image. Therefore, shape failures and internal failures of the three-dimensional semiconductor device may be readily detected from the three-dimensional image.

Figure 11:
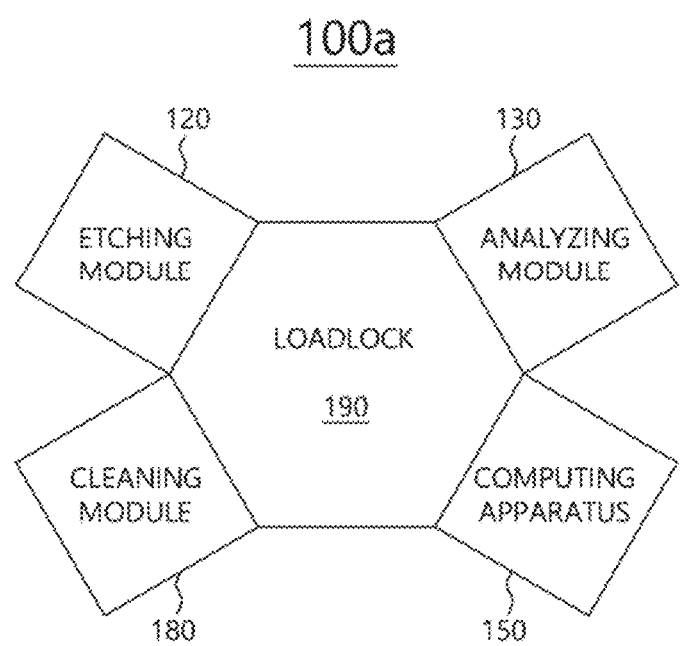
FIG. 11 is a block diagram illustrating a system for analyzing a semiconductor device in accordance with example embodiments.

FIG. 11 is a block diagram illustrating a system 100a for analyzing a semiconductor device in accordance with example embodiments.

Referring to FIG. 11, the etching module 120, the analyzing module 130, the computing apparatus 150, and the cleaning module 180 in the system 100a may be constituted in a cluster shape. The wafer w may be on standby at a loadlock.

Thus, the clustered etching module 120, the analyzing module 130, the computing apparatus 150, and the cleaning module may be systematized to improve inspection efficiency.

According to example embodiments, the system for inspecting the semiconductor device may etch the entire surface of the wafer at the same etch rate by the uniform depth. The two-dimensional images of the etched surface may be taken. The system may serially stack the two-dimensional images to generate the three-dimensional image. Thus, the system may readily detect three-dimensional failures in a highly integrated three-dimensional device from the three-dimensional image of the device obtained by collecting the two-dimensional images.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications may be realized in view of the present disclosure and are intended to fall within the scope of the appended claims.

What is claimed is:

1. A method of analyzing a semiconductor device, the method comprising:
   repeatedly etching an entire surface of a wafer at a same etch rate by a target depth to expose a next surface of the wafer;
   obtaining two-dimensional structure information from each repeatedly etched surface of the wafer; and
   serially stacking the repeatedly obtained two-dimensional structure information to generate a three-dimensional image.

2. The method of claim 1, wherein obtaining the two-dimensional structure information comprises:
   obtaining two-dimensional physical information of the wafer; and
   obtaining two-dimensional electrical information of the wafer.

3. The method of claim 1, wherein obtaining two-dimensional structure information comprises classifying the two-dimensional images by target depths and two-dimensional coordinates (X, Y).

4. The method of claim 3,
   wherein the two-dimensional structure information is serially stacked based on the target depths and the two-dimensional coordinates.

5. The method of claim 1, further comprising analyzing byproducts generated in etching the wafer.

6. The method of claim 5, wherein an amount of the byproducts is analyzed to control the target depth.

7. The method of claim 1, further comprising cleaning the etched surface of the wafer between repeated etchings of the surface of the wafer and obtaining the two-dimensional structure information.

8. A method of analyzing a wafer on which a semiconductor device is formed, the method comprising:
   repeatedly etching an entire surface of a wafer by a target depth to expose a next surface of the wafer, thereby providing a plurality of etched surfaces;
   imaging the plurality of etched surfaces in two-dimensional structures, thereby forming a plurality of two-dimensional images; and
   serially stacking the plurality of two-dimensional images base on order of occurrence of the etched surfaces to generate a three-dimensional image to the wafer.

9. The method of claim 8, wherein forming the two-dimensional structure information comprises:
   obtaining two-dimensional physical information of the wafer; and
   obtaining two-dimensional electrical information of the wafer.

10. The method of claim 8, wherein forming the two-dimensional structure information comprises:
    classifying the two-dimensional images by target depths and two-dimensional coordinates (X, Y).

11. The method of claim 10, wherein the plurality of two-dimensional images is serially stacked based on the target depths and the two-dimensional coordinates.

12. The method of claim 8, further comprising analyzing byproducts generated in etching the wafer.

13. The method of claim 12, wherein an amount of the byproducts is analyzed to control the target depth.

14. The method of claim 8, wherein the entire surface of the wafer is etched with the same etch rate.

* * * * *